United States Patent [19]

Sakai

[11] Patent Number: 5,019,366
[45] Date of Patent: May 28, 1991

[54] PROCESS FOR PREPARING COMPOUND METAL OXIDE

[75] Inventor: Kazuhiro Sakai, Saitama, Japan

[73] Assignee: Mitsubishi Metal Corporation, Tokyo, Japan

[21] Appl. No.: 354,198

[22] Filed: May 19, 1989

[30] Foreign Application Priority Data

May 23, 1988 [JP] Japan .................................. 63-123971

[51] Int. Cl.$^5$ ............................................. C01F 17/00
[52] U.S. Cl. .................................... 423/592; 423/579; 423/593
[58] Field of Search ........................ 423/592, 593, 579

[56] References Cited

U.S. PATENT DOCUMENTS

| | | | |
|---|---|---|---|
| 4,886,654 | 12/1989 | Ohga | 423/593 |
| 4,900,536 | 2/1990 | Snyder | 423/593 |
| 4,902,655 | 2/1990 | Snyder | 423/593 |

Primary Examiner—Peter D. Rosenberg
Attorney, Agent, or Firm—Oblon, Spivak, McClelland, Maier & Neustadt

[57] ABSTRACT

Compound oxides of bismuth, strontium, calcium and copper of a specific metal content ratio can be prepared by refluxing an organic solvent solution containing alkoxides of bismuth, strontium, calcium and an organic acid salt, an alkoxy-$\beta$-keto complex, $\beta$-diketo complex or $\beta$-ketoester complex in said specific metal content ratio, and thermally decomposing the refluxed reaction product.

6 Claims, No Drawings

PROCESS FOR PREPARING COMPOUND METAL OXIDE

FIELD OF THE INVENTION

This invention relates to a process for preparing compound metal oxides. More particularly, this invention relates to a process for preparing compound metal oxides of specific compositions, which are useful as superconductors, oxygen sensors, catalysts, etc. Compound metal oxides of bismuth, strontium, calcium and copper of specific compositions are known as superconductive substances which turn superconductive at no lower than 77K, and have been attracting the attention of scientists.

BACKGROUND OF THE INVENTION

Typical processes known today for preparation of compound metal oxides are:

(1) A process comprising physically pulverizing and mixing oxide, carbonate or oxalate of respective metals, firing the mixture and pulverizing the fired mixture; and (2) a process comprising preparing a homogeneous aqueous solution of a water-soluble salt such as nitrate, hydrochloride, etc. of respective metals, adding hydroxide ions, carbonate ions, oxalate ions or the like to the solution to form insoluble coprecipitate of hydroxides, carbonates, oxalates or the like of the metals, collecting the precipitate and firing it.

In the process (1), mixed powder is fired. Therefore, the reaction proceeds from the boundary of the particles and is liable to leave unreacted portions. This means that the products are not uniform and the composition thereof deviates from the intended one.

In the process (2), conditions for precipitation differ from element to element in a solution. Therefore, from a solution containing a plurality of metals in a specific content ratio, a compound metal oxide in which the metals are contained in the same content ratio as in the solution cannot be formed.

We have found that compound metal oxides of bismuth, strontium, calcium and copper of specific compositions can be prepared by spraying an organic solvent solution containing a bismuth alkoxide, a strontium alkoxide, a calcium alkoxide and an alkoxy-$\beta$-diketo complex, $\beta$-diketo complex or $\beta$-ketoester complex of copper in an intended specific content ratio with respect to the metals and firing the sprayed mist after the solution has been allowed to react.

DISCLOSURE OF THE INVENTION

This invention provides a process for preparing a compound metal oxide of bismuth, strontium, calcium and copper comprising mixing (1) a $C_1$–$C_6$ alkoxide of bismuth, (2) a $C_1$–$C_6$ alkoxide of strontium, (3) a $C_1$–$C_6$ alkoxide of calcium and (4) an organic acid salt, a $C_1$–$C_6$ alkoxy $\beta$-diketo complex, $\beta$-diketo complex or $\beta$-ketoester complex of copper with an organic solvent in the same content ratio of the metals as that in the object compound metal oxide; allowing the mixture to react at the refluxing temperature; spraying the reaction mixture and firing the sprayed mist.

In the present invention, bismuth alkoxide is a compound represented by the formula $Bi(OR^1)(OR^2)(OR^3)$ wherein $R^1$, $R^2$ and $R^3$ are the same or different $C_1$–$C_6$ alkyl.

In the present invention, strontium alkoxide and calcium alkoxide are compounds represented by the formula $A(OR^1)(OR^2)$ wherein A is Sr or Ca and $R^1$ and $R^2$ are the same or different $C_1$–$C_6$ alkyl. $C_1$–$C_4$ alkoxides are preferred.

In the present invention, specific examples of usable organic acid salts of copper are formate, propionate, acetate, citrate, gluconate, tartrate, oxalate, naphthenate, 2-ethylhexanoate, etc. Acetate, higher fatty acid salt, naphthenate and 2-ethyl-hexanoate are preferred.

$C_1$–$C_6$ alkoxide, $C_1$–$C_6$ alkoxy-$\beta$-diketo complex, $\beta$diketo complex and $\beta$-ketoester complex of copper are represented by the formula $Cu(OR)_l(X)_m$, wherein R is $C_1$–$C_6$ alkyl; l is 0 or 1, m is 1 or 2 and that $l+m=2$; and X is a group represented by the formula

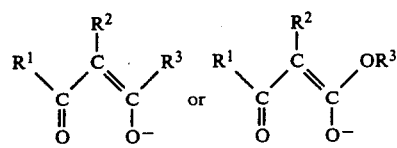

wherein $R^1$ are $R^3$ are $C_1$–$C_6$ alkyl and $R^2$ is hydrogen or $C_1$–$C_6$ alkyl.

In the process of the present invention, almost all organic solvents can be used insofar as they dissolve the above alkoxides and copper complexes and are inert to these substances. Specific examples are esters such as ethyl acetate, ethyl propionate, etc.; alcohols such as methyl alcohol, ethyl alcohol, n- and iso-propyl alcohol, n-, iso-, sec- and tert- butyl alcohol, n-pentyl alcohol, iso-amyl alcohol, hexyl alcohol, octyl alcohol, etc.; aliphatic saturated hydrocarbons such as pentane, hexane, cyclohexane, methylcyclohexane, etc.; aromatic hydrocarbons such as benzene, toluene, xylene, etc.; cyclic ethers such as tetrahydrofuran, dioxane, etc.; cellosolves such as methyl cellosolve, ethyl cellosolve, butyl cellosolve, etc.; formamides such as dimethylformamide, diethyformamide, etc.; and sulfoxides such as dimethylsulfoxide, diethylsulfoxide, etc. These solvents can be used singly or in combination.

The solvents should preferably be well dried and free from carbon dioxide.

In the process of the present invention, dissolution of the starting materials is accelerated by warming. However, the temperature should preferably does not exceed 100° C. so that the starting materials do not decompose.

The solution is kept at the boiling temperature of the solvent used. It is believed that a compound alkoxide of the four metals is formed. The refluxing should preferably be conducted thoroughly. By this operation, polymerization of the compound alkoxide proceeds and enables production of a good compound metal oxide at a relatively low temperature in the thermal decomposition that follows.

The spraying and firing of the reaction product can be effected by spraying the reaction mixture into a heated quartz sleeve by means of a double nozzle or a pressurizing spray nozzle; forming droplet mist by dropping the reaction mixture on a rotating disc and introducing the formed mist into a high temperature atmosphere; or forming a droplet mist by means of an ultrasonic vibrator and introducing the formed mist into a high temperature reaction zone, etc. Thus the reaction product turns into a compound oxide.

The firing, i.e. thermal decomposition, should preferably be conducted at a temperature not lower than 500°

C. in order to effect thermal decomposition completely and allow the resulting oxide to polymerize to some extent. However, the firing temperature preferably should not exceed 1000° C., because thermal decomposition rapidly occurs at the surface of droplets, resulting in hollow particles. At temperatures below 500° C., thermal decomposition is incomplete leaving undecomposed substances, although polymerization of oxide proceeds.

The metal alkoxides and copper complexes used in the present invention can be easily purified, are easily soluble in organic solvents, react well in an organic solution and turn into a highly pure compound oxide in which the atomic ratio of the metals in the solution is retained. Spray-firing gives minute particles which are uniform in particles size and composition.

SPECIFIC DESCRIPTION OF THE INVENTION

The invention will now be illustrated by way of working examples.

Example 1

Bismuth triisopropoxide $Bi[OCH(CH_3)_2]_3$, strontium diisopropoxide $Sr[OCH(CH_3)_2]_2$, calcium diisopropoxide $Ca[OCH(CH_3)_2]_2$ and copper acetylacetonate $Cu(CH_3COCHCOCH_3)_2$ were separately dissolved in isopropanol so that the concentration of the metal was 0.035 mol/l. Each 200 ml, 200 ml, 200 ml and 400 ml of the respective solutions were taken, mixed and thoroughly stirred. The solution was refluxed for 4 hours.

The resultant reaction mixture was sprayed in a quartz sleeve 90 mm in inside diameter and 1 m in length kept at 700° C. through a nozzle having a diameter of 0.4 mm by blowing air as a carrier at a rate of 10 l/min into the sleeve. Additional air was blown into the sleeve as an auxiliary carrier at a rate of 6 l/min. Thus powder of a compound metal oxide was obtained by thermal decomposition.

The data obtained by X-ray diffraction analysis of this powder corresponded to the compound metal oxide reported as $BiSrCaCu_2O_{5.5}$, which accorded with the content ratio of the metals in the solution.

Observation by an electron microscope revealed that the powder comprised secondary particles each packed with primary particles having a diameter of 0.031 lm.

The powder was compacted into pellets and sintered at 850° C. for 2 hours in an oxygen atmosphere and thereafter cooled slowly. The superconductivity critical temperature Tc of the pellets was measured and found to be 80K. The Tc of 80K. was reproducibly observed and the difference between the onset point and the end point was within 5K.

Example 2

Bismuth triisopropoxide $Bi[OCH(CH_3)_2]_3$, strontium diisopropoxide $Sr[OCH(CH_3)_2]_2$, calcium diisopropoxide $Ca[OCH(CH_3)_2]_2$ were separately dissolved in isopropanol and copper acetylacetonate $Cu(CH_3COCHCOCH_3)_2$ was dissolved in benzene so that the concentration of the metal was 0.035 mole/l, and 200 ml, 200 ml, 100 ml and 200 ml of the respective solutions were taken mixed and thoroughly stirred. The solution was refluxed for 4 hours.

The resultant reaction mixture was sprayed in the same quartz sleeve as used in Example 1 kept at 800° C. through the same nozzle as used in Example 1 by blowing air as a carrier at a rate of 10 l/min into the sleeve. Also additional air was blown into the sleeve as an auxiliary carrier at the same rate as in Example 1.

The data obtained by X-ray diffraction analysis corresponded to the composition of the compound metal oxide reported as $Bi_2Sr_2CaCu_2O_8$. Observation by an electron microscope revealed that the powder comprised secondary particles each packed with primary particles having a diameter of 0.03 μm.

The powder was compacted into pellets and sintered at 820° C. for 2 hours in an oxygen atmosphere and thereafter cooled slowly. The superconductivity critical temperature (Tc) of the pellets was measured and found to be 80K. The Tc of 80K was reproducibly observed and the difference between the onset point and the end point was within 5K.

Example 3

Bismuth trimethoxide $Bi(OCH_3)_3$, strontium dimethoxide $Sr(OCH_3)_2$, calcium dimethoxide $Ca(OCH_3)_2$ and copper acetylacetonate $Cu(CH_3COCHCOCH_3)_2$ were separately dissolved in methanol so that concentration of the metal was 0.035 mol/l. Each 100 ml, 100 ml, 100 ml and 200 ml of the respective solutions were taken, mixed and thoroughly stirred. The solution was refluxed for 4 hours. The resultant reaction mixture was treated in the same manner as in Example 1 and a homogeneous stable compound oxide was obtained.

Physical properties of the thus obtained compound oxide powder were measured. The data obtained by X-ray diffraction analysis corresponded to the compound metal oxide reported as $BiSrCaCu_2O_{5.5}$. Observation by an electron microscope revealed that the powder comprised secondary particles each packed with primary particles having a diameter of 0.02 μm.

Further, the superconductivity critical temperature Tc was measured and found to be 74K. The difference between the onset point and the end point was within 5K.

Example 4

Bismuth triisopropoxide $Bi(OCH(CH_3)_2)_3$, strontium diisopropoxide $Sr(OCH(CH_3)_2)_2$, calcium diethoxide $Ca(OC_2H_5)_2$ and copper acetate $Cu(CH_3COO)_2$ were separately dissolved in isopropanol so that the concentration of the metal was 0.035 mol/l. Each 100 ml, 100 ml, 100 ml and 200 ml of the respective solutions were taken, mixed and thoroughly stirred. The solution was refluxed for 4 hours. The resultant reaction mixture was treated in the same manner as in Example 1 and a homogeneous stable compound oxide was obtained.

Physical properties of the thus obtained compound oxide powder were measured. The data obtained by X-ray diffraction analysis corresponded to a compound metal oxide reported as $BiSrCaCu_2O_{5.5}$. Observation by an electron microscope revealed that the powder comprised secondary particles each packed with primary particles having a diameter of 0.02 μm.

Further, the superconductivity critical temperature Tc was measured and found to be 75K. The difference between the onset point and the end point was within 5K.

What claim is:

1. A process for preparing a metal oxide of bismuth, strontium, calcium and copper comprising:
   dissolving
   (1) a $C_1$-$C_6$ alkoxide of bismuth,
   (2) a $C_1$-$C_6$ alkoxide of strontium,
   (3) a $C_1$-$C_6$ alkoxide of calcium, and (4) an organic acid salt, a $C_1$-$C_6$ alkoxy-$\beta$-diketo complex, $\beta$-diketo complex, or $\beta$-ketoester complex of copper in an organic solvent, in the same content ratio of the metals as that in the object compound metal oxide;

allowing the mixture oxide to react at the refluxing temperature; and thermally decomposing the resultant reaction mixture while in sprayed condition.

2. A process for preparing a metal oxide of bismuth, strontium, calcium and copper as recited in claim 1 wherein $C_1$-$C_4$ alkoxides of bismuth, strontium, and calcium are used.

3. A process for preparing a metal oxide of bismuth, strontium, calcium and copper as recited in claim 1, wherein a solvent selected from alcohols and aliphatic and aromatic hydrocarbons is used.

4. A process for preparing a metal oxide of bismuth, strontium, calcium and copper as recited in claim 1, wherein copper acetate, copper naphthenate, copper 2-ethyl hexanoate or higher fatty acid salt of copper is used as a copper source.

5. A process for preparing a metal oxide of bismuth, strontium, calcium and copper as recited in claim 1, wherein a $C_1$-$C_4$ alkoxy-$\beta$-diketo complex, $\beta$-diketo complex or $\beta$-ketoester complex of copper is used.

6. A process for preparing a metal oxide of bismuth, strontium, calcium and copper as recited in claim 1, wherein the thermal decomposition under the sprayed condition is conducted at a temperature of 500° to 1000° C.

* * * * *